United States Patent
Minemura et al.

(10) Patent No.: US 8,658,998 B2
(45) Date of Patent: Feb. 25, 2014

(54) SEMICONDUCTOR STORAGE DEVICE

(75) Inventors: Hiroyuki Minemura, Kokubunji (JP); Yumiko Anzai, Saitama (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 13/457,889

(22) Filed: Apr. 27, 2012

(65) Prior Publication Data

US 2012/0273742 A1 Nov. 1, 2012

(30) Foreign Application Priority Data

Apr. 28, 2011 (JP) ................................ 2011-101129

(51) Int. Cl.
*H01L 47/00* (2006.01)

(52) U.S. Cl.
USPC ........................................ 257/2; 257/3; 257/4

(58) Field of Classification Search
USPC .......................................... 257/2–5; 365/163
See application file for complete search history.

(56) References Cited

U.S. PATENT DOCUMENTS

| | | | | |
|---|---|---|---|---|
| 7,126,149 B2* | 10/2006 | Iwasaki et al. | .................... | 257/3 |
| 7,507,985 B2* | 3/2009 | Iwasaki et al. | .................... | 257/3 |
| 7,705,343 B2* | 4/2010 | Suh et al. | ........................ | 257/4 |
| 7,936,044 B2* | 5/2011 | Kim et al. | ..................... | 257/529 |
| 8,026,502 B2* | 9/2011 | Kakegawa | ........................ | 257/3 |
| 8,241,947 B2* | 8/2012 | Liu et al. | ........................ | 438/102 |
| 8,363,463 B2* | 1/2013 | Shih et al. | ..................... | 365/163 |
| 2005/0029505 A1 | 2/2005 | Lowrey | | |
| 2008/0049490 A1 | 2/2008 | Hosaka et al. | | |
| 2008/0205128 A1 | 8/2008 | Nakai | | |
| 2009/0140233 A1* | 6/2009 | Kinoshita et al. | ................. | 257/4 |
| 2009/0321878 A1 | 12/2009 | Koo et al. | | |
| 2010/0163828 A1* | 7/2010 | Tu | ..................... | 257/3 |
| 2010/0327251 A1* | 12/2010 | Park | .................. | 257/2 |
| 2011/0235408 A1* | 9/2011 | Minemura et al. | ............ | 365/163 |
| 2012/0119181 A1* | 5/2012 | Oh et al. | ........................ | 257/4 |
| 2012/0281466 A1* | 11/2012 | Liu et al. | ....................... | 365/163 |
| 2012/0286229 A1* | 11/2012 | Liu | .............................. | 257/4 |
| 2012/0307555 A1* | 12/2012 | Liu | .............................. | 365/163 |

FOREIGN PATENT DOCUMENTS

| | | | |
|---|---|---|---|
| JP | 2007-501519 A | 1/2007 |
| JP | 2008-218492 A | 9/2008 |
| JP | 2009-117854 A | 5/2009 |
| JP | 2010-010688 A | 1/2010 |

* cited by examiner

*Primary Examiner* — Matthew W Such
*Assistant Examiner* — Stephen C Smith
(74) *Attorney, Agent, or Firm* — Miles & Stockbridge P.C.

(57) ABSTRACT

An intermediate layer including at least one of elements constituting a phase change material and silicon is arranged between a recording layer composed of the phase change material and an $n^+$ polysilicon film to reduce contact resistance between the recording layer and the $n^+$ polysilicon film, thereby simplifying the structure of a phase change memory and reducing the cost thereof. If the phase change material contains Ge, Sb, and Te, for example, the intermediate layer includes at least one of Si—Sb, Si—Te, and Si—Ge.

7 Claims, 7 Drawing Sheets

SEMICONDUCTOR STORAGE DEVICE

CLAIM OF PRIORITY

The present application claims priority from Japanese patent application JP 2011-101129 filed on Apr. 28, 2011, the content of which is hereby incorporated by reference into this application.

FIELD OF THE INVENTION

The present invention relates to a semiconductor storage device and, in particular, to a technique effectively applicable to a semiconductor storage device including a rewritable nonvolatile solid state memory device for storing information using a material whose electric resistance reversibly changes by current flowing therein.

BACKGROUND OF THE INVENTION

In recent years, a resistance random access memory (ReRAM) acting as a semiconductor memory replacing a flash memory on the verge of limitation of miniaturization has been studied. As an example among the semiconductor memories, a phase change memory using chalcogenide material as a recording material has been actively studied.

The phase change memory is a nonvolatile solid state memory device for storing information using the property that a phase change material such as $Ge_2Sb_2Te_5$ being a recording material increases in resistance in an amorphous state and decreases in resistance in a crystalline state. The fundamental device structure is such that a phase change film is sandwiched between a pair of metal electrodes.

Data reading is performed such that a potential difference is applied across both ends of the device to measure current flowing into the device, thereby determining whether the device is in a high resistance state or in a low resistance state. Data is rewritten such that the state of the phase change film is changed between the amorphous and crystalline states by Joule heat generated by the current.

Reset operation, in other words, the operation that the state of the phase change film is changed to the amorphous state of high resistance, is performed such that a relatively large current is caused to flow to melt the phase change film and then the current is rapidly decreased to quench the phase change film. On the other hand, set operation, in other words, the operation that the state of the phase change film is changed to the crystalline state of low resistance, is performed such that a relatively small current is caused to flow to keep the phase change film at a crystallization temperature or higher.

The phase change film in the phase change memory is decreased in volume as the phase change memory is miniaturized, in order to decrease current required to change the resistance.

Patent document 1 (Japanese Unexamined Patent Application Publication No. 2008-218492) discloses a multi-valued memory technique in which phase change areas are provided at a portion where the phase change film is in contact with an upper electrode (an upper heater) and a portion where the phase change film is in contact with a lower electrode (a lower heater) and the portion where the phase change film is in contact with the upper electrode is made larger in area than the portion where the phase change film is in contact with the upper electrode to write two bits in a one-bit memory cell area.

Patent document 2 (Japanese Unexamined Patent Application Publication (Translation of PCT Application) No. 2007- 501519) discloses that Ti, TiN, TiSiN, AlTiN, TiW, C, SiC, TaN, polycrystalline silicon are suited for an electrode material sandwiching the phase change film.

Patent document 3 (Japanese Unexamined Patent Application Publication No. 2009-117854) discloses that C, W, Mo, TiN, TiW are suited for a resistor material in a phase change memory in which a first layer formed of a phase change material and a second layer (a heater) formed of the resistor material are provided between a first and a second electrode.

Patent document 4 (Japanese Unexamined Patent Application Publication No. 2010-010688) discloses a technique in which a metal silicide layer acting as a diffusion barrier and a Schottky barrier is provided at a crossing portion of a first and a second electrode in a resistance change memory in which a recording layer (a data storage layer) acting as a phase transition resistor is provided at the crossing portion of the first and second electrodes.

SUMMARY OF THE INVENTION

As described above, a conventional phase change memory is configured such that a heater of TiN adjacent to the phase change film acting as a recording layer and an electrode of TiSiN, W, and AlTiN are arranged. The electric conduction of the above materials is due to free-electron conduction as is the case with metal, so that, hereinafter, the materials may be referred to as metallic material.

As described in Patent document 1, a transistor acting as a current switch is essential to rewrite and read data. The transistor is formed of Si being a semiconductor material. As is well known, the electric conduction of Si or Si to which impurities (dopants) are added is caused by carriers of a semiconductor.

The capacity of the phase change memory is desired to be increased and the cost thereof is desired to be reduced. In consideration that a current switch of Si is indispensable for the phase change memory, the use a Si material in an electrode material allows reducing the kinds of materials to be used and simplifying the production process of the materials to be used, so that it is desirable to use the Si material in the electrode material in view of cost reduction.

As is well known, bonding Si being a semiconductor material to different types of materials produces contact resistance on both the interfaces according to difference in the conduction mechanism. If a material bonded to Si is a metallic material, a Schottky junction is formed, which is also a phenomenon that effectively increases electric resistance, so that, hereinafter, the Schottky junction including components thereof is referred to as contact resistance. As described in Patent document 4, a method for forming metal silicide is widely used to reduce the contact resistance between the Si and the metal.

It is also effective to simplify the structure of the heater and the electrode formed between the Si transistor and the recording layer (the phase change film) for the purpose of reducing the cost of the phase change memory. The simplest device structure is obtained by directly joining the Si to the phase change material typified by Ge—Sb—Te.

However, the contact resistance for the case where the Si is directly joined to the phase change material has not yet been reported in documents including the above patent documents.

The inventors produced a sample (a sample A) shown in FIG. 1 to measure a contact resistance among Si, metal and a recording layer (Ge—Sb—Te).

In FIG. 1, in a first stage of forming a device, a silicon substrate 10 is thermally oxidized and a thermal oxidation film (a silicon oxide film) 11 which is 300 nm in film thickness (t) is formed on the surface of the silicon substrate 10. On the thermal oxidation film 11 are sequentially deposited a TiN film 12 with t=10 nm, a W film 13 with t=200 nm, a TiN film 14 with t=20 nm, an n⁺ polysilicon film 15 with t=50 nm, and a silicon oxide film 16 with t=50 nm in this order by a sputtering method or a chemical vapor deposition (CVD) method.

A hole 17 with a predetermined diameter (d) is formed in a portion of the topmost silicon oxide film 16 using an electron beam lithography technique. The structure described above is referred to as a device substrate. On the upper portion of the device substrate are deposited a recording layer 18 of a $Ge_2Sb_2Te_5$ film with t=50 nm and an upper electrode 19 of a W film with t=50 nm by an RF magnetron sputtering method to complete the device.

The joining of the Si (the n⁺ polysilicon film 15) to the phase change material of Ge—Sb—Te (the recording layer 18) is evaluated using the device structure shown in FIG. 1. The joining of the Si to the metal (W) is evaluated such that the device structure is produced in which the upper electrode 19 of the W film is directly formed above the device substrate. Furthermore, the joining of the phase change material (Ge—Sb—Te) to the metal (W) is evaluated such that the device structure is produced in which the recording layer 18 and the upper electrode 19 are directly formed above the device substrate in which the thermal oxidation film 11 to the W film 13 are formed.

The resistance value of a sample having a junction area at the bottom of the hole 17 with a diameter 200 nm is measured using the above device structure to obtain the following results:

(1) Joining of the Si and the metal: about 20 kΩ
(2) Joining of Ge—Sb—Te to the metal: about 100Ω
(3) Joining of Si to Ge—Sb—Te: about 1 MΩ.

The above measurement proves that the joining of the Si to the phase change material (Ge—Sb—Te) makes contact resistance significantly larger than that of the Si to the metal and of the phase change material to the metal.

The present invention solves the problem that the joining of the Si to the phase change material increases contact resistance and provides a technique that simplifies the structure of the phase change memory and reduces the cost thereof.

The above and other objects of the present invention will be apparent from the description of the specification and the accompanying drawings.

In accordance with one principal aspect of the invention, the above problem is solved by forming an intermediate layer which contains any of constituent elements of the phase change material and Si. The intermediate layer is formed of a material small in contact resistance with the Si and with the phase change material, between the Si and the phase change material.

If the constituent elements of the phase change material are Ge—Sb—Te, for example, Si—Sb and Si—Te can be taken as examples of materials constituting the intermediate layer. If the constituent elements of the phase change material are Ge—Sb—Te—Sn—Bi, for example, Si—Sb, Si—Te, Si—Bi, and Si—Sn can be taken as examples.

Using this technique, the structure of the phase change memory can be simplified and the cost thereof can be reduced.

DETAILED DESCRIPTION OF THE PREFERRED EMBODIMENTS

Figure 1:
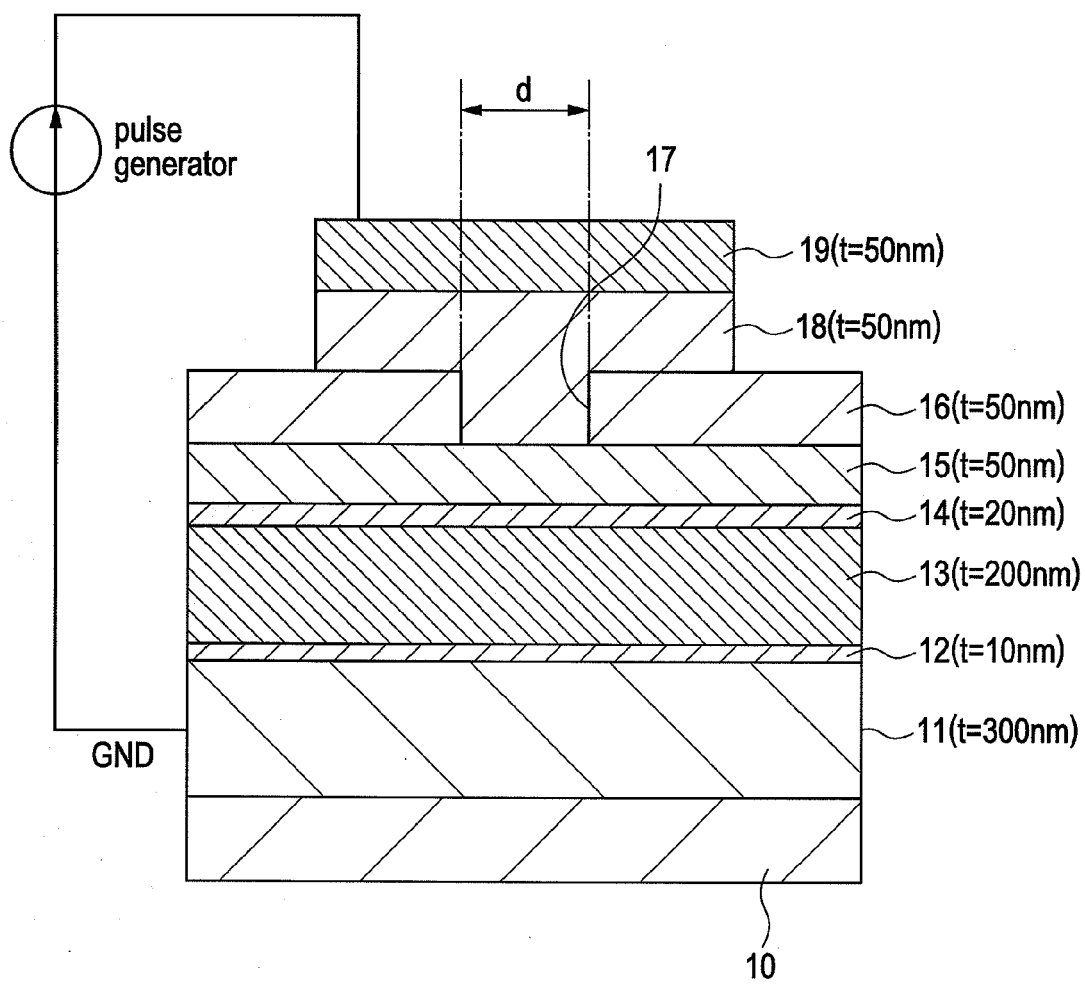
FIG. 1 is a cross section showing the structure of a device used in a comparative example (a sample A)

An embodiment of the present invention is described in detail below with reference to the accompanying drawings. The member having a similar function is given the same reference character and numeral to omit a repetitive description thereof in all the drawings for describing the embodiment. It is needless to say that the places where a characteristic configuration is described are not limited to the embodiments and the similar effects can be obtained if a common configuration is employed. For the sake of easy understanding, shading may be omitted on a cross section in the drawings for describing the embodiments.

Figure 2:
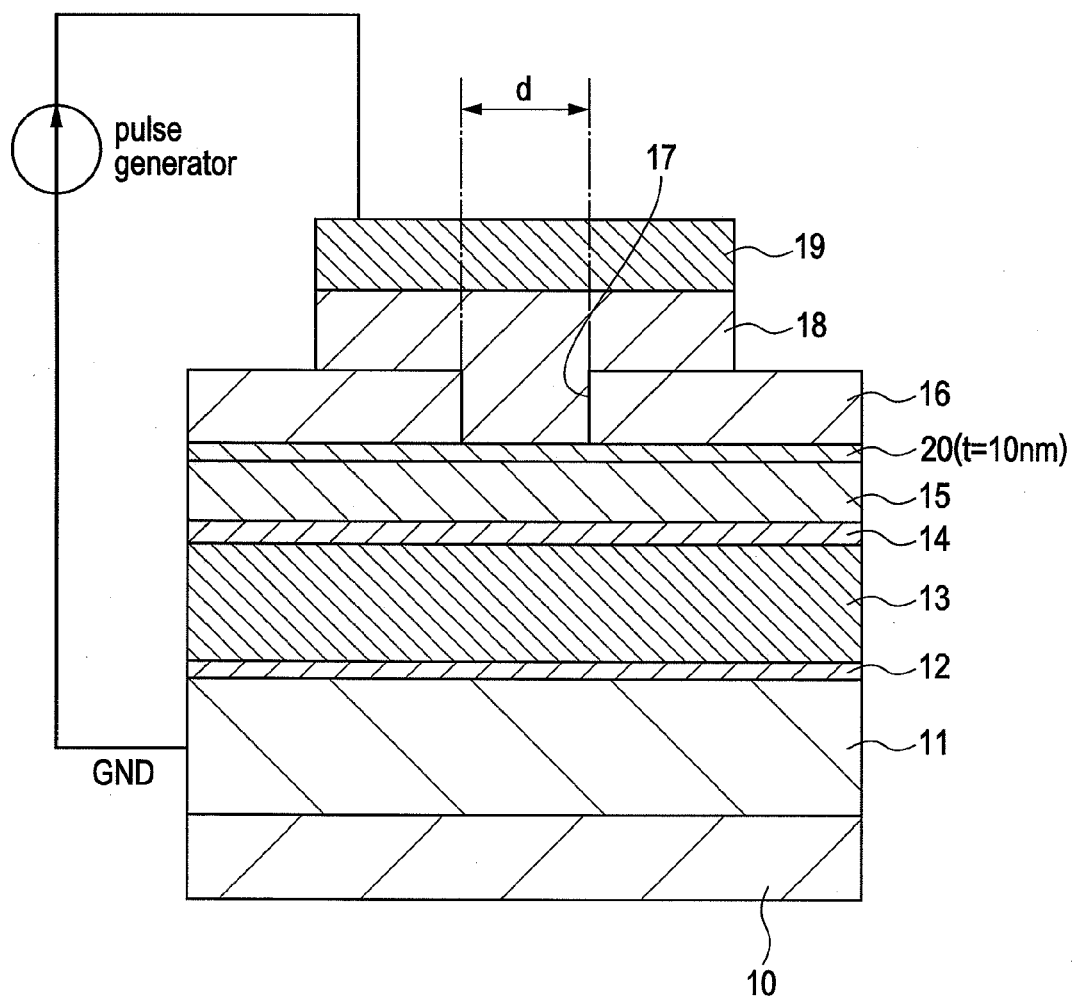
FIG. 2 is a cross section showing the structure of a device (a sample B) according to an embodiment of the present invention.

FIG. 2 is a cross section showing a device structure (referred to as sample B) according to the present embodiment. The sample B was produced such that a 10-nm thick intermediate layer 20 of Si—Sb (Si:Sb=75:25) was formed between a phase change material (a recording layer 18) and an n⁺ polysilicon film 15 by the sputtering method. Other than that, the sample B was produced in the manner similar to that used in the sample A shown in FIG. 1. The samples A and B use $Ge_2Sb_2Te_5$ in the phase change material (the recording layer 18) and are 50 nm in thickness. The phase change material was crystallized by annealing at 250° C. for three minutes.

Figure 3:
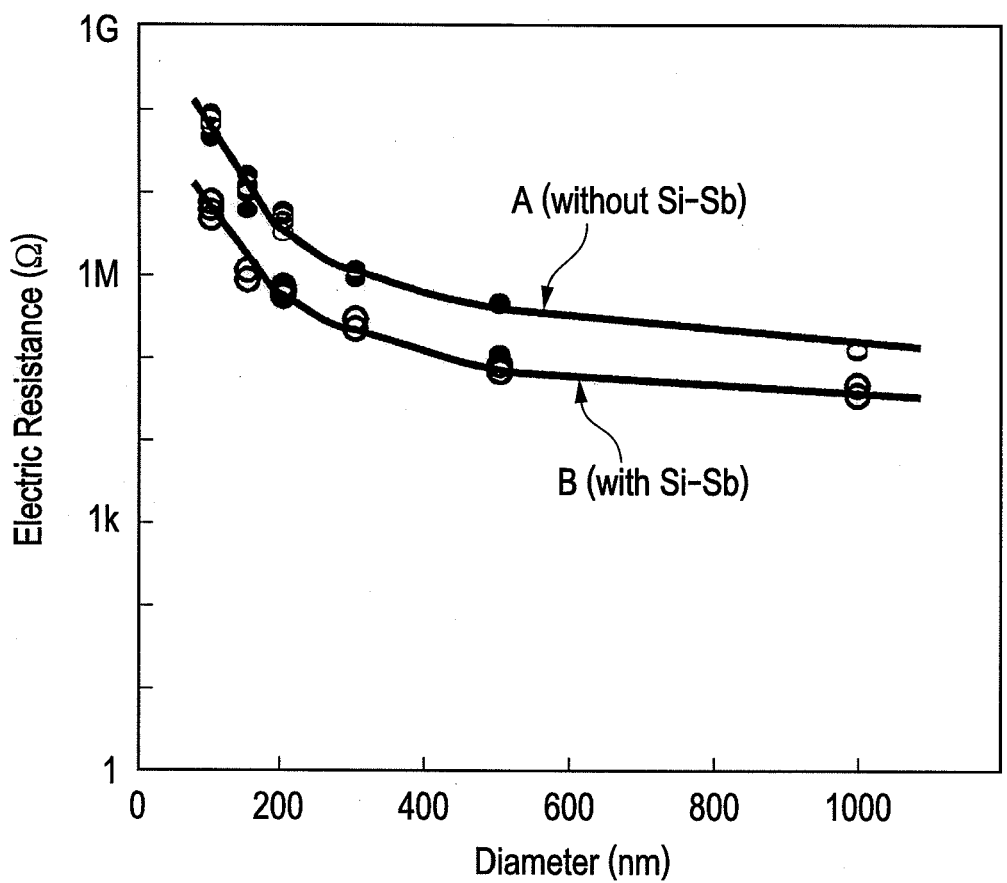
FIG. 3 is a graph showing results of measuring resistance values of the sample B using Si—Sb in an intermediate layer.

FIG. 3 shows results obtained when the resistance value of the annealed sample is measured. The abscissa indicates the diameter of the hole 17. A voltage applied to the sample to measure resistance value was 0.1 V. Hereinafter, the condition for measuring resistance value is unified to that.

As can be seen from FIG. 3, the sample B in which the intermediate layer 20 of Si—Sb is formed between the n⁺ polysilicon film 15 and the phase change material (the recording layer 18) is smaller in electric resistance than the sample A in which the n⁺ polysilicon film 15 is directly joined to the phase change material (the recording layer 18).

This means that the contact resistance between the n⁺ polysilicon film 15 and the phase change material (the recording layer 18) via the intermediate layer 20 of Si—Sb is smaller than the contact resistance between the n⁺ polysilicon film 15 and the phase change material (the recording layer 18). This is because a part of the Sb elements included in the intermediate layer 20 is substituted with the Si element in the n⁺ polysilicon film 15 and acts as an n-type dopant. This is also because the n⁺ polysilicon film 15 is impregnated with the major part of the Sb elements included in the intermediate layer 20 and the Sb elements maintain their characteristics as a single Sb to prevent the contact resistance with the phase change material (the recording layer 18) from being increased.

The effects similar to those described above can be obtained if Si—Te and Si—Ge are used as materials for the intermediate layer 20. The phase change material (the recording layer 18) can include Sn and Bi as well as Ge—Sb—Te as the constituent element. In this case, the use of Si—Sn or Si—Bi as the material of the intermediate layer 20 allows obtaining the effects similar to those described above.

Figure 4:
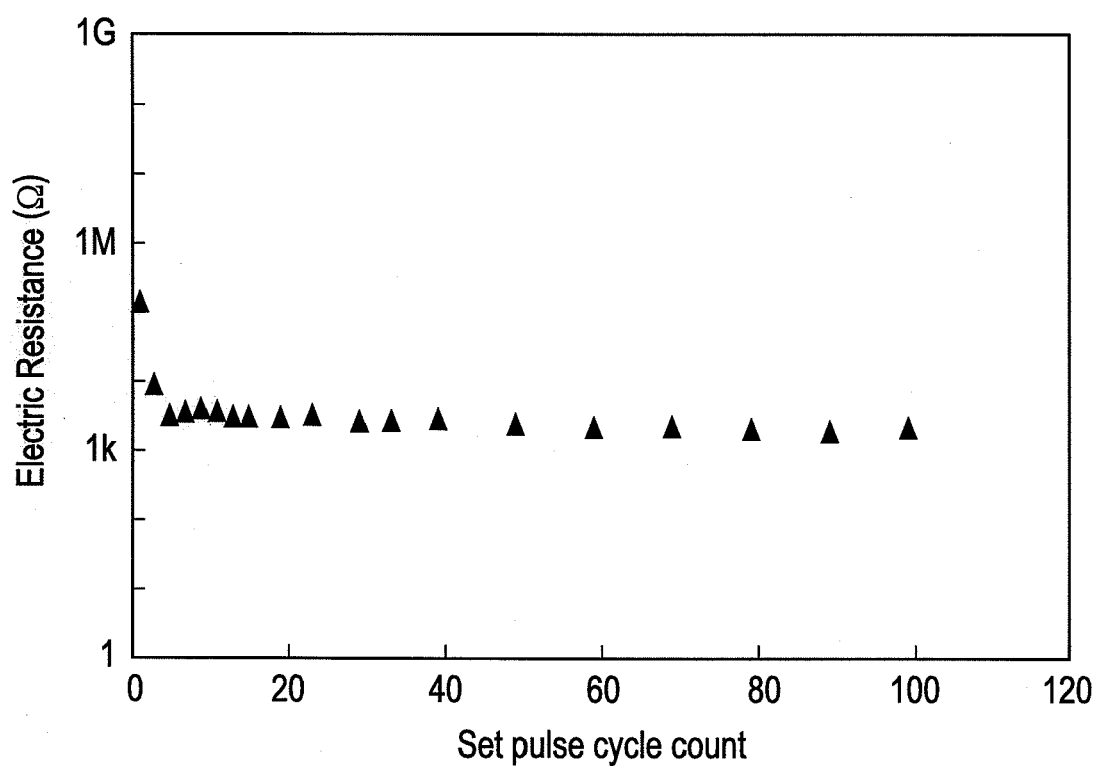
FIG. 4 is a graph showing results of measuring the relationship between the number of applications of crystallization current pulse and resistance values of the sample B.

The element was tested using a low current pulse to measure a response of the element to pulse current. FIG. 4 shows the results of measurement of the sample B (FIG. 2) in which a 200-nm diameter hole 17 is formed.

The low current pulse uses a pulse with a rise time of 1 μs (microsecond), a peak hold time of 2 μs, and a fall time of 8 μs. A peak current value is taken as 7 mA. As is clear from the figure, a significant decrease in resistance could be observed until the low current pulse was applied three times. This change seems to be mainly due to the recovery of crystallinity on the surface of the n$^+$ polysilicon film 15 lowered in forming the hole 17 by the electron beam lithography and the uniformity of deviation of distribution in composition of the phase change material.

Figure 5A:
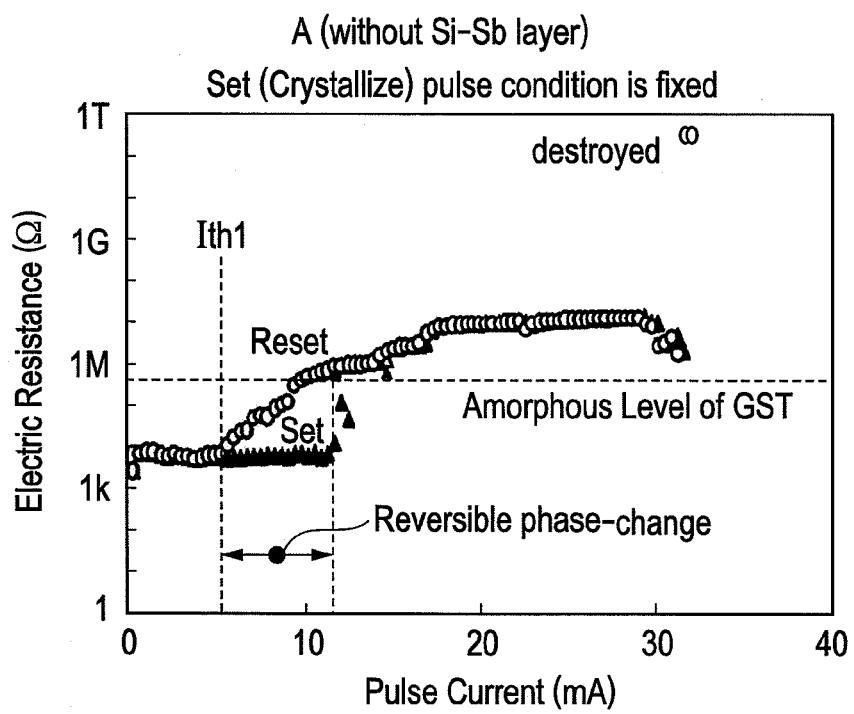
FIG. 5A shows results of measuring switching characteristics of the sample B by current pulse and FIG. 5B shows results of measuring switching characteristics of the sample A by current pulse.
Figure 5B:
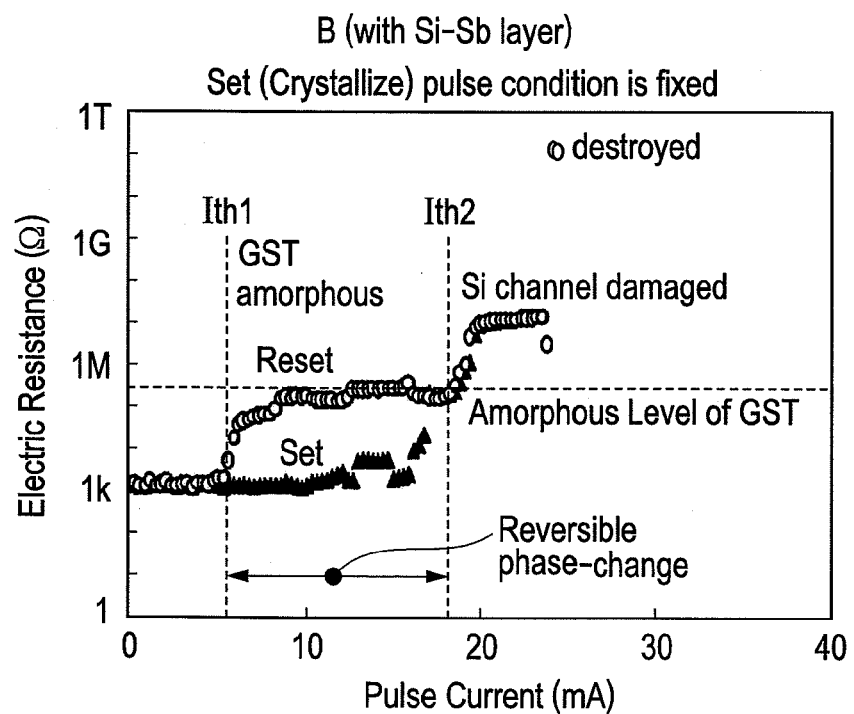

FIGS. 5A and 5B show results of measuring switching characteristics of the device by the current pulse. The current pulse used for reset (for increasing resistance) has arise time of 5 ns (nanosecond), a peak hold time of 25 ns, and a fall time of 5 ns. The current pulse used for set (for decreasing resistance) has a rise time of 1 μs, a peak hold time of 2 μs, and a fall time of 8 μs. The reset and set pulses were alternately applied to the samples A and B. The peak current value of the reset pulse was varied. The peak current value of the set pulse was kept constant at 4 mA. The hole 17 is 200 nm in diameter.

As can be seen from FIG. 5A, in the sample A without the intermediate layer (Si—Sb) 20, the resistance value of the device continuously increases as the reset current increases and the device causes an irreversible change precluding a decrease in resistance by the set pulse and leads to breakdown. The resistance value of the device at the time of causing the irreversible change is 10 times or more as high as that of the phase change material in an amorphous state separately measured by a metal electrode, so that the breakdown may result in deterioration of the Si material.

As can be seen from FIG. 5B, in the sample B with the intermediate layer (Si—Sb) 20, the relationship between the reset current and device resistance-value has two flat areas in a high resistance state. The resistance value of the flat area appearing at a small current area substantially agrees with the resistance value of the phase change material in an amorphous level and the resistance value can be reversibly reduced. The resistance value of a second flat area appearing at a large current area is 10 times or more as high as that of the phase change material in an amorphous level, and the resistance value cannot be reversibly returned to a low resistance state. The latter seems to be attributed to the deterioration of the Si material.

Normally, in the phase change memory, a large number of memory bits are formed on one semiconductor chip. It is inevitable that the thickness and shape of each memory bit are accompanied by a production dispersion. Clearly separating the reset condition under which the reversible device resistance-value can be switched and the reset condition under which the device resistance-value becomes irreversible and letting the former have a predetermined current margin for production dispersion of the device are required for reliably rewriting the phase change memory.

The above results show that the intermediate layer (Si—Sb) 20 is provided between the phase change material (the recording layer 18) and the Si (the n$^+$ polysilicon film 15) to improve reliability in rewriting the phase change memory. This is because thermal influence and diffusion of materials between the Si and the phase change material are inhibited by interposing the intermediate layer (Si—Sb) 20 therebetween. Such an effect is a second effect according to the present invention following the above reduction in the contact resistance.

Figure 6A:
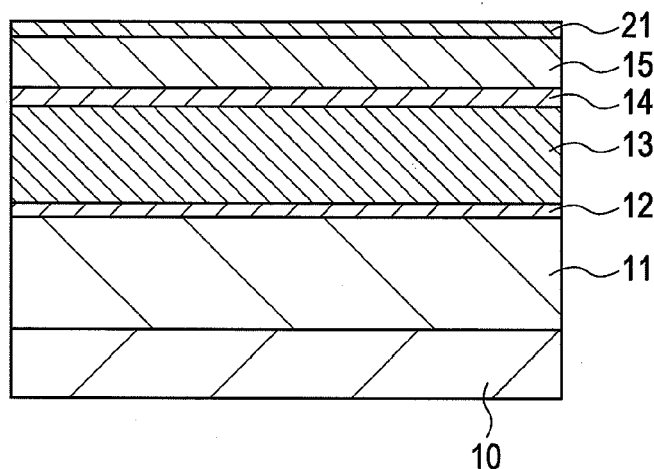
FIGS. 6A, 6B, and 6C are cross sections showing other methods for forming the structure of a device which are embodiments of the present invention.
Figure 6B:
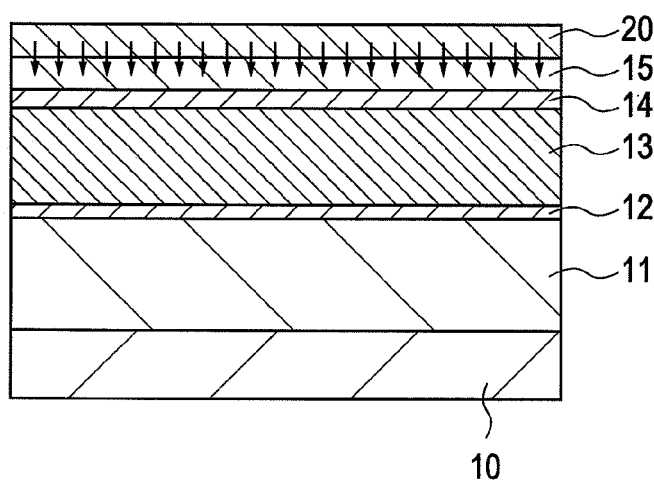

FIGS. 6A and 6B show another embodiment related to a method for forming the intermediate layer 20. In the above experiment, the intermediate layer 20 of Si—Sb was formed by the sputtering method as is the case with the phase change material (the recording layer 18). Herein, FIGS. 6A and 6B show the phase change memory formed with the intermediate layer 20 of which composition is gradually changed from the side where the intermediate layer 20 is joined to the Si (the n$^+$ polysilicon film 15) to the side where the intermediate layer 20 is joined to the phase change material (the recording layer 18).

Figure 6C:
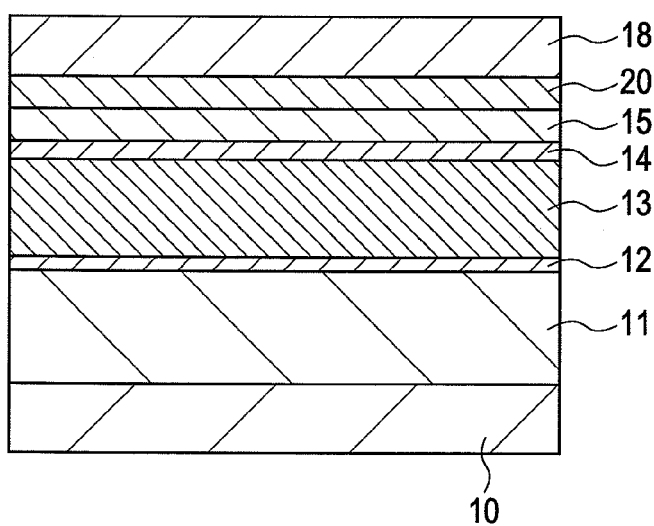

The n$^+$ polysilicon film 15 of a transistor, a diode and a wiring (generically referred to as an Si circuit unit) is formed and, as shown in FIG. 6A, an Sb film 21 which is one of constituent elements of the phase change material is formed thereon by the sputtering method. A silicon substrate 10 is subjected to heat treatment to diffuse the Sb element into the n$^+$ polysilicon film 15, thereby allowing forming an intermediate layer (Si—Sb) 20 in which Sb content by percentage gradually changes in the direction of film thickness, as shown in FIG. 6B. Thereafter, as shown in FIG. 6C, the phase change material (the recording layer 18) is formed on the intermediate layer 20 and subjected to a suitable process, allowing forming the phase change memory.

In the device, the intermediate layer 20 can be obtained in which Si content by percentage is high in the vicinity of junction with the Si (the n$^+$ polysilicon film 15) and Sb content by percentage is high in the vicinity of junction with the phase change material (the recording layer 18). The above discussion enables further reduction in the contact resistance by the constitution of the device.

Figure 7:
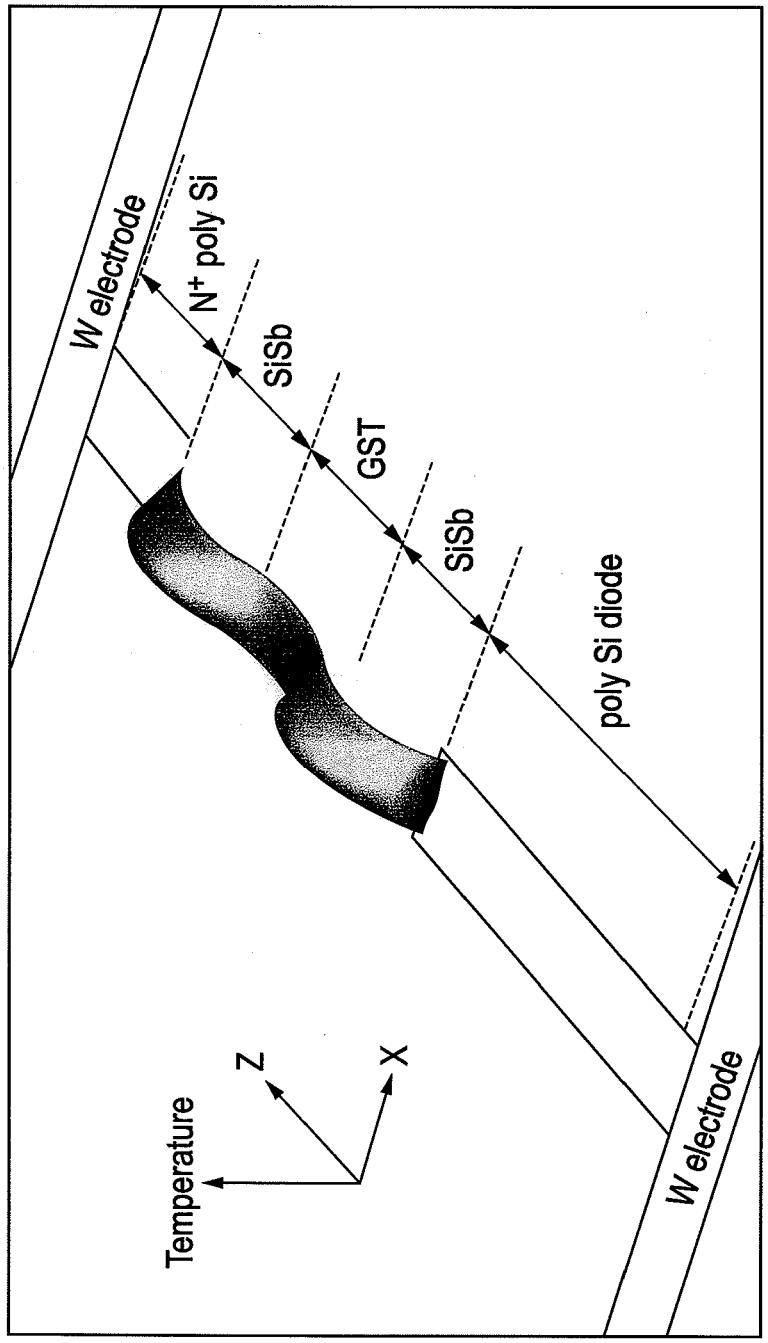
FIG. 7 shows results of simulation of temperature distribution at the time of resetting the device connected with a diode.

FIG. 7 shows the structure of the phase change memory including a polysilicon diode as a switching device according to the present invention and simulation results of temperature distribution at the time of applying a reset current pulse. The simulation results were obtained under the condition that the intermediate layer 20 is larger in electrical resistivity than the phase change material in a crystalline state. The materials of the intermediate layer 20 satisfying the condition include Si—Sb, Si—Te, Si—Bi, and Si—Sn.

As can be seen from the figure, the intermediate layer (Si—Sb) 20 is higher in temperature than any other layer and fulfils the same function as the heater material described in Patent document 1 to provide an effect for reducing the reset pulse current.

The invention made by the inventors is described in detail above based on the embodiments. It is to be understood that the present invention is not limited to the embodiments and various modifications may be made therein without departing from the spirit of the invention.

The materials of the intermediate layer 20 are not limited to the binary materials (Si—Sn, Si—Te, Si—Ge, Si—Sn, and Si—Bi). If it is necessary to improve reliability of the device by adjusting melting point, electric conductivity, crystal lattice constant, and surface energy, for example, the intermediate layer 20 may be formed of a ternary or a quaternary material in which a third or a fourth element is added to the binary material.

For example, Si—Ag, Si—Mo, Si—V, Si—Ti, Si—Co, Si—Mn, Si—Mg, Si—In, Si—Cr, Si—Zr, or Si—Hf or a mixture thereof is added thereto to allow the contact resistance to be further reduced. It is also effective to add Si—$ZrO_2$, Si—$SiO_2$, or Si—$TiO_2$ thereto to reduce the electric conductivity.

The present invention is applicable to the semiconductor storage device with the phase change memory.

What is claimed is:

1. A semiconductor storage device comprising a phase change memory including at least a recording unit having a phase change material and a circuit unit having a silicon semiconductor layer,
wherein the recording unit is electrically connected with the circuit unit via an intermediate layer,
wherein the intermediate layer includes at least one of elements constituting the phase change material and silicon, and
wherein silicon content by percentage in the intermediate layer gradually increases from an interface with the recording unit toward an interface with the circuit unit.

2. The semiconductor storage device according to claim 1, wherein the phase change material contains Ge, Sb, and Te and the intermediate layer includes at least one of Si—Sb, Si—Te, and Si—Ge.

3. The semiconductor storage device according to claim 2, wherein the phase change material further includes at least one of Sn and Bi and the intermediate layer further includes at least one of Si—Sn and Si—Bi.

4. The semiconductor storage device according to claim 3, wherein the intermediate layer further includes at least one of Si—Ag, Si—Mo, Si—V, Si—Ti, Si—Co, Si—Mn, Si—Mg, Si—In, Si—Cr, Si—Zr, Si—Hf, Si—$ZrO_2$, Si—$SiO_2$, and Si—$TiO_2$.

5. The semiconductor storage device according to claim 2, wherein the intermediate layer further includes at least one of Si—Ag, Si—Mo, Si—V, Si—Ti, Si—Co, Si—Mn, Si—Mg, Si—In, Si—Cr, Si—Zr, Si—Hf, Si—$ZrO_2$, Si—$SiO_2$, and Si—$TiO_2$.

6. The semiconductor storage device according to claim 1, wherein a wiring composed of the silicon semiconductor layer, a transistor, or a diode is formed in the circuit unit.

7. The semiconductor storage device according to claim 1, wherein the intermediate layer is 10 nm in thickness.

* * * * *